(12) United States Patent
Yang et al.

(10) Patent No.: US 9,997,617 B2
(45) Date of Patent: Jun. 12, 2018

(54) METAL OXIDE SEMICONDUCTOR (MOS) ISOLATION SCHEMES WITH CONTINUOUS ACTIVE AREAS SEPARATED BY DUMMY GATES AND RELATED METHODS

(71) Applicant: QUALCOMM Incorporated, San Diego, CA (US)

(72) Inventors: Bin Yang, San Diego, CA (US); Xia Li, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 233 days.

(21) Appl. No.: 13/799,955

(22) Filed: Mar. 13, 2013

(65) Prior Publication Data
US 2014/0264610 A1 Sep. 18, 2014

(51) Int. Cl.
*H01L 29/66* (2006.01)
*H01L 29/78* (2006.01)
(Continued)

(52) U.S. Cl.
CPC ........ *H01L 29/6681* (2013.01); *H01L 21/765* (2013.01); *H01L 21/7624* (2013.01);
(Continued)

(58) Field of Classification Search
CPC ....... H01L 21/28123; H01L 21/823878; H01L 21/765
(Continued)

(56) References Cited

U.S. PATENT DOCUMENTS 5,268,312 A   12/1993  Reuss et al.
5,688,722 A   11/1997  Harrington, III
(Continued)

FOREIGN PATENT DOCUMENTS

CN   102104041 A   6/2011
EP     2341537 A2   7/2011
(Continued)

OTHER PUBLICATIONS

Langfelder G., "Isolation of Highly Doped Implants on Low-Doped Active Layers for CMOS Radiation Drift Detectors," IEEE Transactions on Electron Devices, Aug. 2009, vol. 56 (8), pp. 1767-1773.
(Continued)

*Primary Examiner* — Matthew Reames
*Assistant Examiner* — John Bodnar
(74) *Attorney, Agent, or Firm* — W&T/Qualcomm (57) ABSTRACT

Embodiments disclosed in the detailed description include metal oxide semiconductor (MOS) isolation schemes with continuous active areas separated by dummy gates. A MOS device includes an active area formed from a material with a work function that is described as either an n-metal or a p-metal. Active components are formed on this active area using materials having a similar work function. Isolation is effectuated by positioning a dummy gate between the active components. The dummy gate is made from a material having an opposite work function relative to the material of the active area. For example, if the active area was a p-metal material, the dummy gate would be made from an n-metal, and vice versa.

13 Claims, 9 Drawing Sheets

(51) Int. Cl.
*H01L 21/765* (2006.01)
*H01L 27/02* (2006.01)
*H01L 21/762* (2006.01)
*H01L 21/8238* (2006.01)

(52) U.S. Cl.
CPC .. *H01L 21/823878* (2013.01); *H01L 27/0207* (2013.01); *H01L 29/785* (2013.01); *H01L 21/823842* (2013.01)

(58) Field of Classification Search
USPC .......................... 257/372, 386, 394; 438/294
See application file for complete search history.

(56) References Cited

U.S. PATENT DOCUMENTS

| | | | |
|---|---|---|---|
| 6,756,619 | B2 | 6/2004 | Tran |
| 6,759,726 | B1 | 7/2004 | Anceau et al. |
| 2003/0124871 | A1* | 7/2003 | Arghavani ........ H01L 21/28035 438/763 |
| 2004/0142546 | A1 | 7/2004 | Kudo et al. |
| 2010/0127333 | A1 | 5/2010 | Hou et al. |
| 2011/0147765 | A1* | 6/2011 | Huang .............. H01L 21/28123 257/77 |
| 2011/0215404 | A1 | 9/2011 | Zhu et al. |
| 2012/0001232 | A1 | 1/2012 | Liaw |
| 2012/0107729 | A1* | 5/2012 | Blatchford ........ H01L 21/28123 430/5 |
| 2012/0126336 | A1* | 5/2012 | Anderson ............. H01L 21/765 257/392 |
| 2013/0049835 | A1* | 2/2013 | Hoist ................... H03K 3/0375 327/203 |
| 2013/0187237 | A1* | 7/2013 | Yu ................... H01L 21/823807 257/369 |

FOREIGN PATENT DOCUMENTS

| | | |
|---|---|---|
| JP | H0955437 A | 2/1997 |
| JP | 2001345430 A | 12/2001 |
| JP | 2005064317 A | 3/2005 |
| JP | 2007311491 A | 11/2007 |
| JP | 2010123947 A | 6/2010 |

OTHER PUBLICATIONS

He, G., et al., "Review and Perspective of Hf-based High-k Gate Dielectrics on Silicon," Critical Reviews in Solid State and Material Sciences, vol. 37, No. 3, Sep. 12, 2012, pp. 131-157.
International Search Report and Written Opinion for Patent Application No. PCT/US2014/022263, dated Jun. 25, 2014, 13 pages.
Second Written Opinion for PCT/US2014/022263, dated Feb. 18, 2015, 8 pages.
International Preliminary Report on Patentability for PCT/US2014/022263, dated Jun. 3, 2015, 24 pages.

* cited by examiner

FIG. 8 ized. Unlike polygate MOS
METAL OXIDE SEMICONDUCTOR (MOS) ISOLATION SCHEMES WITH CONTINUOUS ACTIVE AREAS SEPARATED BY DUMMY GATES AND RELATED METHODS

BACKGROUND

I. Field of the Disclosure

The technology of the disclosure relates to metal oxide semiconductors (MOS).

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. These and other factors contribute to a continued miniaturization of components and power consumption within the circuitry. Miniaturization of components impacts all aspects of the processing circuitry, including the transistors and other reactive elements in the processing circuitry including metal oxide semiconductors (MOS).

Historically MOS devices have benefited from increasing miniaturization efforts, for example, advancing from 0.25 micrometer (μm) scale down through 0.13 λm to a twenty-eight (28) nanometer (nm) scale, with current efforts working on a twenty (20) nm scale. Such semiconductor miniaturization not only reduced the footprint area occupied by the MOS devices in an integrated circuit (IC), but also reduced the power required to operate such IC and concurrently improved operating speeds. As the MOS devices are reduced to a nanometer scale, for example, ninety (90) nm scale, the footprint area occupied by the MOS devices in the IC was reduced as expected. However, the MOS devices could not operate at an appreciably faster speed, because the mobility of the current mechanism (i.e., electrons or holes) did not also improve linearly because the mobility is a function of the effective mass of the current mechanism, and the effective mass was not changing with the miniaturization.

Additionally, existing MOS devices have relied on shallow trench isolation (STI) between active elements to provide desired isolation between the devices. However, as the miniaturization reaches the nanometer scale, STI takes up valuable space within the IC.

Various techniques have been implemented to attempt to improve the speed with which MOS devices operate in the nanometer scale. One example includes introducing stress on the MOS channel element to improve mobility of the current mechanism. Stress inducing elements rely on physical dimensions of the stressor to provide the stress. That is, to introduce a large stress to improve mobility, a physically large stressor is used, which conflicts with the miniaturization goals. Additionally, STI interferes with the formation of stressors, reducing the physical dimensions of the stressor that is available to provide the desired stress.

At least one proposed solution to avoid reduced performance associated with the reduction of stress inducing elements was the elimination of the STI breaks with a continuous active area. Instead of the STI breaks, a dummy gate has been inserted between components. However, the isolation provided by such dummy gates has been worse than the isolation provided by STI and/or it requires higher gate bias, which in turn has its own problems such as requiring a power rail, increasing cost and increasing the footprint of the device. Thus, there needs to be an effective isolation technique through which adjacent MOS devices may operate without degradation.

SUMMARY OF THE DISCLOSURE

Embodiments disclosed in the detailed description include metal oxide semiconductor (MOS) isolation schemes with continuous active areas separated by dummy gates. Related methods are also disclosed. In an exemplary embodiment, a MOS device includes an active area with a gate formed from a material with a work function that is described as either an n-metal or a p-metal. Active components are formed on this active area using gate materials having a similar work function. Isolation is effectuated by positioning a dummy gate between the active components. The dummy gate is made from a material having an opposite work function relative to the gate material of the active area. For example, if the gate in the active area was a p-metal material, the dummy gate would be made from an n-metal, and vice versa. The isolation scheme achieved through this structure effectively reduces the amount of leakage current and improves the operating speed of the MOS elements. This isolation scheme also allows the MOS device to be miniaturized without being limited by shallow trench isolation (STI) width and leakage current, with a corresponding speed increase realized that would be expected from technology scaling of the MOS device. Unlike polygate MOS efforts, the gate dielectric films in certain embodiments disclosed herein have a relatively high dielectric constant (k), and thus allow reverse work function type dummy gates to provide the desired isolation while avoiding the need for an isolation implantation zone disposed underneath the dummy gate.

In this regard, in one embodiment, a MOS device is disclosed. The MOS device comprises a first material having a first n-metal or p-metal work function. The MOS device also comprises a first gate comprising the first material. The MOS device also comprises a second gate comprising the first material. The MOS device also comprises a dummy gate positioned between the first gate and the second gate and comprising a second material having a work function opposite that of the first material. The MOS device also comprises a gate dielectric underneath each gate, where the gate dielectric comprises a dielectric constant (k) greater than approximately eighteen (18).

In another exemplary embodiment, a MOS device is disclosed. The MOS device comprises a first means for having a first n-metal or p-metal work function. The MOS device also comprises a first gate means comprising the first means. The MOS device also comprises a second gate means comprising the first means. The MOS device also comprises a dummy gate means positioned between the first gate means and the second gate means and comprising a second means for having a work function opposite that of the first means. The MOS device also comprises a gate dielectric underneath each gate means, where the gate dielectric comprises a dielectric constant (k) greater than approximately eighteen (18).

In another exemplary embodiment, a method of forming a MOS device is disclosed. The method comprises providing a first material having a first n-metal or p-metal work function. The method also comprises forming a gate dielectric on an active area, the gate dielectric comprising a dielectric constant (k) greater than approximately eighteen (18). The method also comprises forming a first gate comprising the first material over the gate dielectric. The method also comprises forming a second gate comprising the first material over the gate dielectric. The method also comprises forming a dummy gate over the gate dielectric, where the dummy gate comprises a second material having a work function opposite that of the first material. The method also comprises positioning the dummy gate between the first gate and the second gate.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include metal oxide semiconductor (MOS) isolation schemes with continuous active areas separated by dummy gates. Related methods are also disclosed. In an exemplary embodiment, a MOS device includes an active area with a gate formed from a material with a work function that is described as either an n-metal or a p-metal. Active components are formed on this active area using gate materials having a similar work function. Isolation is effectuated by positioning a dummy gate between the active components. The dummy gate is made from a material having an opposite work function relative to the gate material of the active area. For example, if the gate in the active area was a p-metal material, the dummy gate would be made from an n-metal, and vice versa. The isolation scheme achieved through this structure effectively reduces the amount of leakage current and improves the operating speed of the MOS elements. This isolation scheme also allows the MOS device to be miniaturized without being limited by shallow trench isolation (STI) width and leakage current, with a corresponding speed increase realized that would be expected from technology scaling of the MOS device. Unlike polygate MOS efforts, the gate dielectric films in certain embodiments disclosed herein have a relatively high dielectric constant (k), and thus allow reverse work function type dummy gates to provide the desired isolation while avoiding the need for an isolation implantation zone disposed underneath the dummy gate.

Before addressing exemplary embodiments of a MOS device employing one or more dummy gates according to the present disclosure, a brief overview of conventional isolation processes within a complementary MOS (CMOS) device is provided with reference to FIGS. 1-4 below. While FIGS. 1-4 deal with CMOS devices, it should be appreciated that a CMOS device is made from a MOS device having an n-metal work function (i.e., an nMOS) and a MOS device having a p-metal work function (i.e., a pMOS). The description of these conventional isolation processes are provided to assist in explaining embodiments employing dummy gates and discussed below with regard to FIGS. 5-7B.

Figure 1:
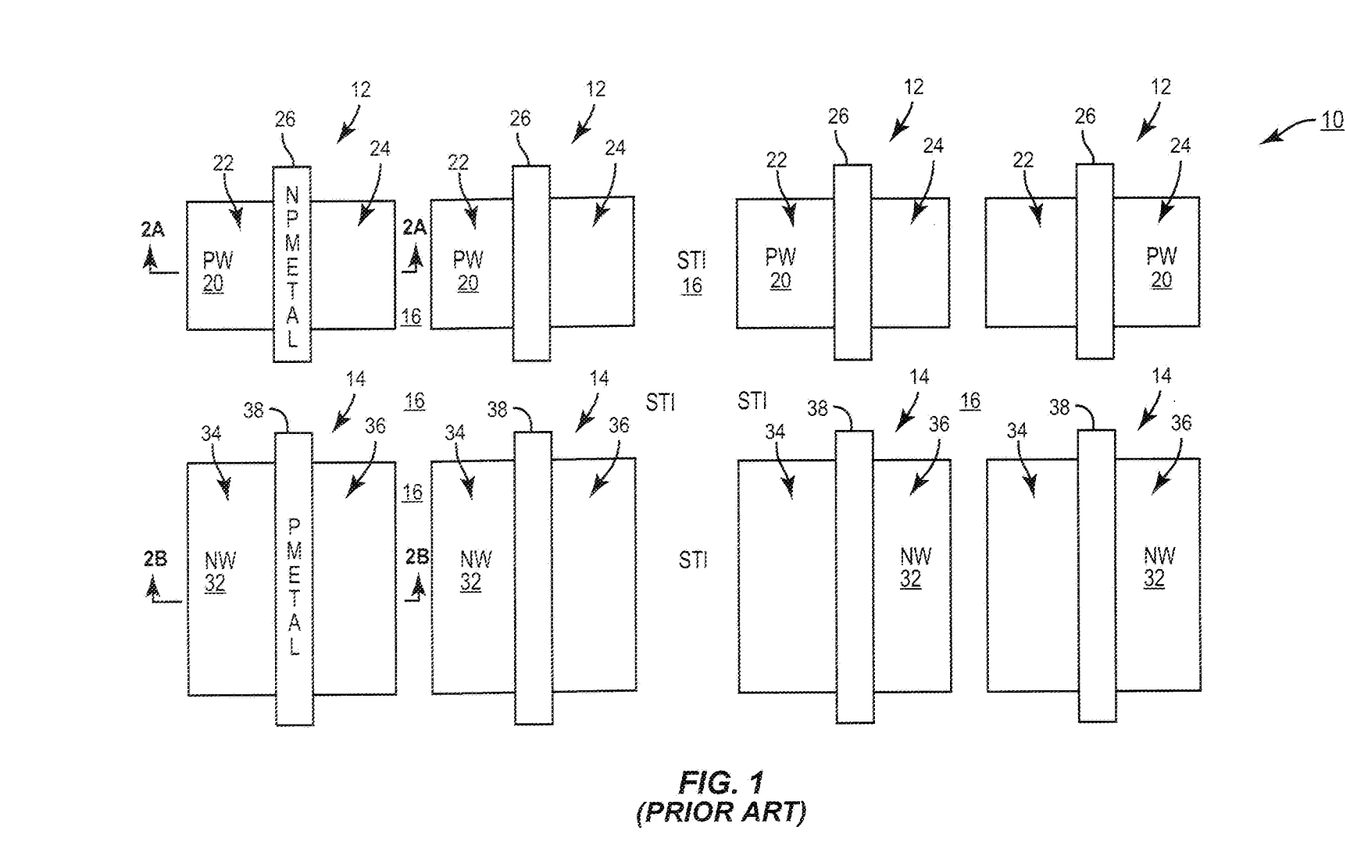
FIG. 1 is a simplified top plan diagram of an exemplary conventional complementary metal oxide semiconductor (MOS) (CMOS) with shallow trench isolation (STI) to isolate active semiconductor components.

In this regard, FIG. 1 is a block diagram of a conventional CMOS device 10. The CMOS device 10 is formed from one or more nMOS field effect transistors (FETs) 12 and one or more pMOS FETs 14. Each FET 12, 14 is separated from the other FETs 12, 14 by STI 16.

Figure 2A:
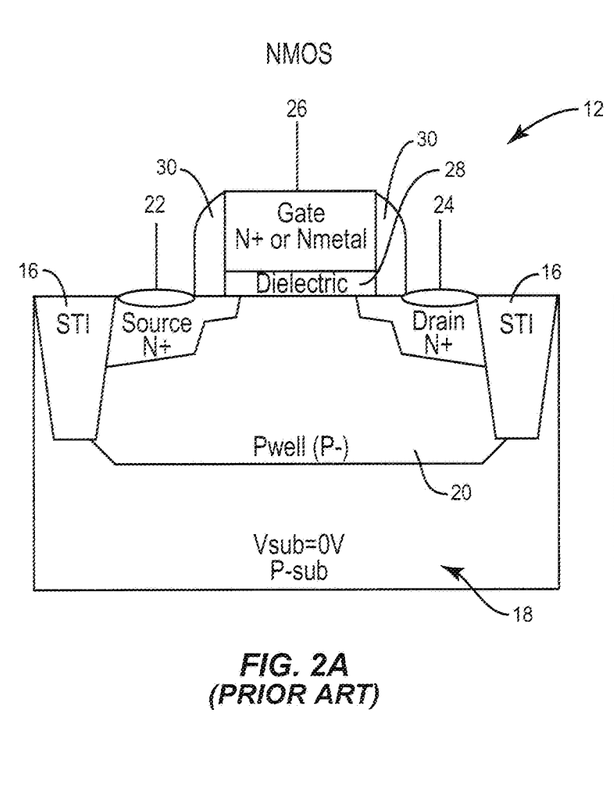
FIG. 2A is a cross-sectional view of an n-metal MOS (nMOS) taken along line 2A-2A of FIG. 1.

As better illustrated in FIG. 2A, the nMOS FET 12 is formed on a substrate 18, which, in an exemplary embodiment is a silicon substrate. A well 20 is formed in the substrate 18, and in an exemplary embodiment, the well 20 has a p− type Fermi energy level (Fermi levels are referred to herein as a defect energy band inside silicon band gap, which is induced by a P type or N type dopant in silicon.) and may referred to as a pwell (or pw) herein. The nMOS FET 12 includes a source 22, a drain 24 and a gate 26. The source 22 and drain 24 are formed in the well 20 and may have an n+ type Fermi energy level (i.e., Fermi energy level very close to conduct band). The gate 26 is formed over the well 20 and separated therefrom by a gate dielectric 28, which may be an oxide layer or the like. The gate 26 is formed from a material having an n-metal work function. Additionally, the gate 26 may have spacers 30 on either side of the gate 26. The nMOS FET 12 includes electrical contacts (not illustrated) for the source 22, drain 24, and gate 26.

Figure 2B:
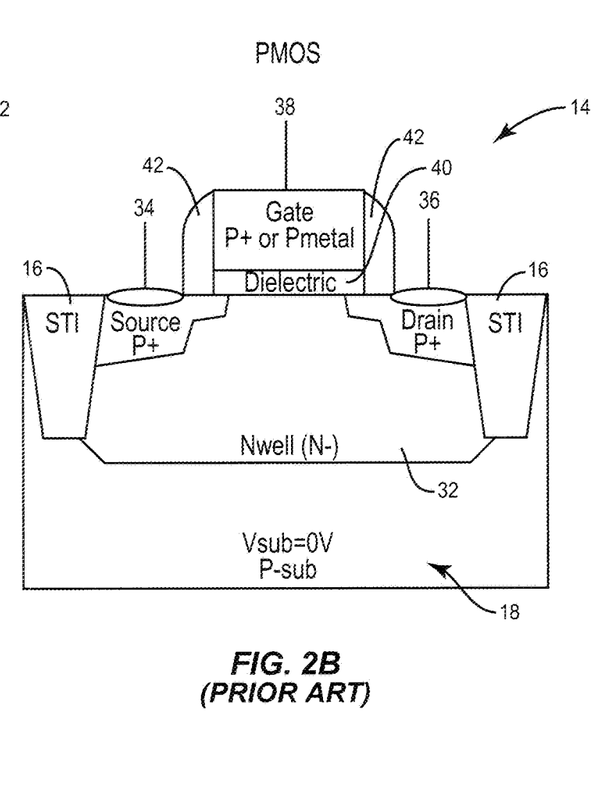
FIG. 2B is a cross-sectional view of a p-metal MOS (pMOS) taken along line 2B-2B of FIG. 1.

Likewise, as illustrated in FIG. 2B, the pMOS FET 14 is formed on the substrate 18, which, in an exemplary embodiment is a silicon substrate. A well 32 is formed in the substrate 18, and in an exemplary embodiment, the well 32 has an n− type Fermi energy level and may referred to as a nwell (or nw) herein. The pMOS FET 14 includes a source 34, a drain 36 and a gate 38. The source 34 and drain 36 are formed in the well 32 and may have a p+ type Fermi energy level. The gate 38 is formed over the well 32 and separated therefrom by a gate dielectric 40, which may be an oxide layer or the like. The gate 38 is formed from a material having a p-metal work function. Additionally, the gate 38 may have spacers 42 on either side of the gate 38. The pMOS FET 14 includes electrical contacts (not illustrated) for the source 34, drain 36, and gate 38.

Returning to FIG. 1, and as noted above, the FETs 12, 14 are separated from each other by the STI 16. STI 16 provides effective electrical isolation for each of the FETs 12, 14. In typical constructions, the isolation provided by the STI breaks such as STI 16 is in the 10 pA/μm range for advance scaling technology. While STI breaks such as STI 16 provide acceptable isolation in many instances, the use of STI breaks is disruptive to a continuous manufacturing process and creates a break between elements, which increases chip size and reduces drive current, which in turn decreases speed and increases power consumption.

While FIGS. 1-2B have focused on CMOS device 10, it should be appreciated that the same concepts and disadvantages are also applicable to other types of MOS devices such as a strictly nMOS device or a strictly pMOS device. Furthermore, while the CMOS device 10 is illustrated as being a planar device, the same techniques are also used for FinFET devices. A FinFET is a term that is used to describe a nonplanar, double- or triple-gate transistor built on a silicon substrate or a silicon on insulator (SOI) substrate. The distinguishing characteristic of the FinFET is that the conducting channel is around a thin silicon "fin", which forms the channel of the device. The length of the fin (measured in the direction from source to drain) determines the effective channel length of the device.

Figure 3:
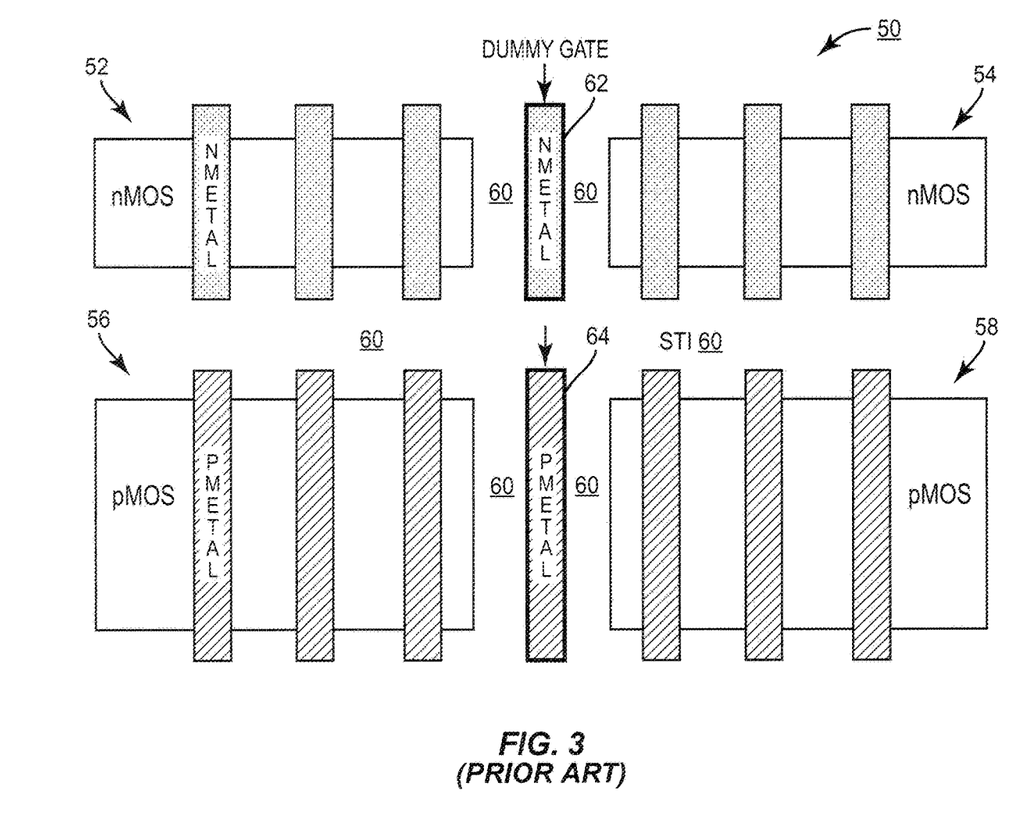
FIG. 3 is a simplified top plan diagram of an exemplary conventional CMOS formed with a continuous active area with an STI break and dummy gate used to isolate field effect transistors (FETs)

An alternate conventional approach, illustrated in FIG. 3, combines an STI with a dummy gate. In this regard, as illustrated in FIG. 3, a CMOS device 50 is formed on a substrate (not illustrated). The CMOS device 50 includes a first nMOS FET 52 and a second nMOS FET 54 as well as a first pMOS FET 56 and a second pMOS FET 58. The FETs 52, 54, 56, 58 are separated from one another by STI 60. Additionally, a dummy gate 62 is positioned between nMOS FETs 52, 54. The dummy gate 62 has an n-metal work function. Similarly, a dummy gate 64 is positioned between pMOS FETs 56, 58. The dummy gate 64 has a p-metal work function. Thus, the work function of the dummy gates 62, 64 corresponds to the work function of the FETs (either 52, 54 or 56, 58) that the dummy gate separates. Again, the use of the STI 60 and the dummy gates 62, 64 provides acceptable isolation (e.g., in the ~10 pA/μm range), but the use of the STI 60 introduces a break in the continuous active area. As noted above, STI 60 impinges on the ability to create stressors of sufficient size to achieve the desired mobility of the current mechanism and the performance of the CMOS device 50 is not improved at smaller sizes (e.g., at twenty-eight (28) nanometer (nm) or below scale).

Figure 4:
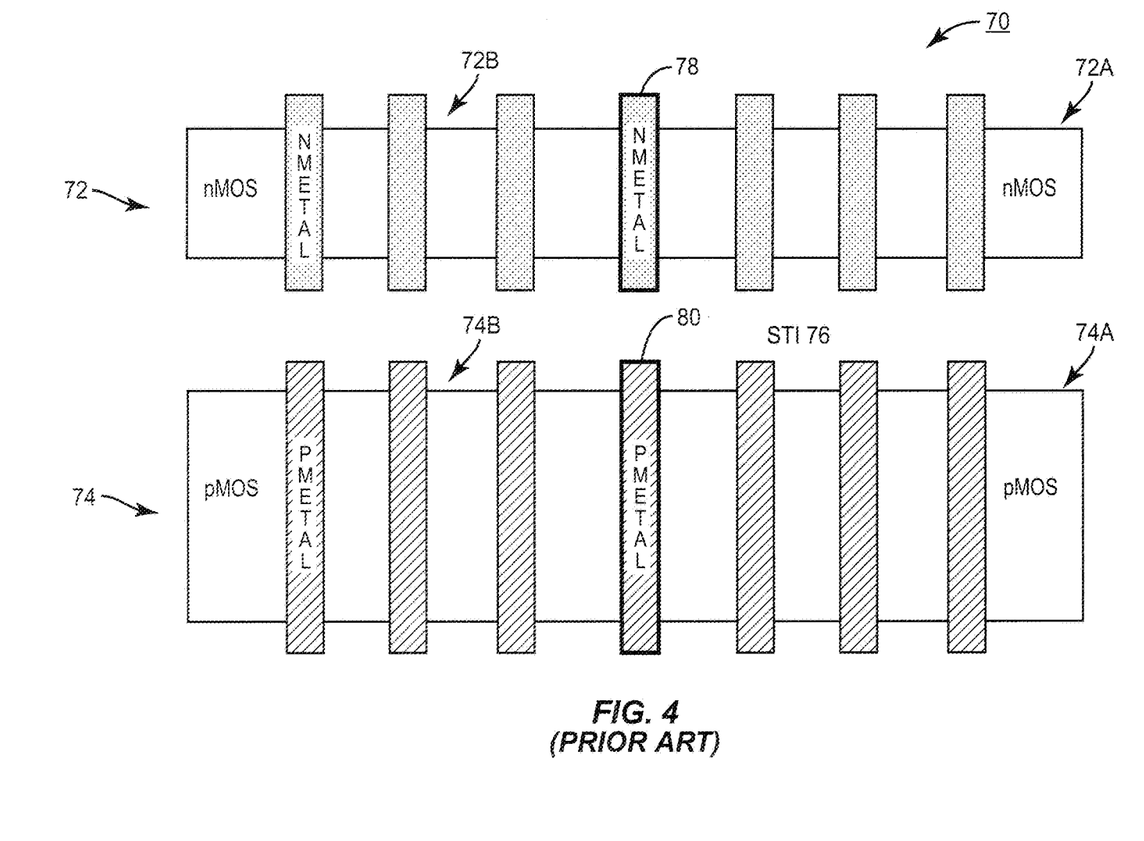
FIG. 4 is a simplified top plan diagram of an exemplary conventional CMOS formed with a continuous active area with a dummy gate used to isolate FETs.

Another alternate conventional approach is illustrated in FIG. 4. FIG. 4 illustrates a CMOS device 70 formed through a continuous active area scheme. In particular, the CMOS device 70 includes nMOS FETs 72A, 72B (collectively 72) and pMOS FETs 74A, 74B (collectively 74). The nMOS FET 72 is separated from the pMOS FET 74 by STI 76. Unlike CMOS device 50 of FIG. 3, the nMOS FET 72A is not separated from the nMOS FET 72B by STI 76. Rather, nMOS FET 72A and nMOS FET 72B are formed from a continuous active area and are separated only by a dummy gate 78. The dummy gate 78 has an n-metal work function. Similarly, the pMOS FET 74A is not separated from the pMOS FET 74B by STI 76. Rather, pMOS FET 74A and pMOS FET 74B are formed from a continuous active area and are separated only by a dummy gate 80. The dummy gate 80 has an p-metal work function. While this exemplary embodiment has the advantage of being formed from a continuous active area scheme, the dummy gates 78, 80 frequently do not provide adequate isolation between the paired FETs 72A, 72B or paired FETs 74A, 74B. For example, in typical nMOS constructions for twenty (20) nm scale devices have 10 nA/μm for an extreme low threshold device, which is approximately one thousand times greater than the leakage of an STI style device. Likewise, a similar device has approximately 350 pA/μm for a standard threshold device, which is approximately thirty-five times greater than the leakage of an STI style device. Thus, current leaks across the dummy gate 78 from one nMOS FET 72A to the nMOS FET 72B (and likewise from pMOS FET 74A to pMOS FET 74B) which degrades the performance of the CMOS device 70. One solution to address the current leakage is to increase the gate bias on the dummy gates 78, 80. For example in an nMOS FET 72, normally the gate bias is 0 V, but to reduce current leakage, a −0.5 V may be applied to the dummy gate 78. Use of such a gate bias requires an extra external power supply, which in turn increases the foot print of the device and increases circuit complexity. Likewise, with a −0.5 V gate bias, Vgs may reach Vdd (e.g., 0.5 V), which is too high for thin gate oxides and may cause unnecessary wear on the gate. Similarly, in a pMOS FET 74, normally Vg=0 V with no isolation, but to reduce leakage current, Vg may be set to Vdd or 0.5 V. Again, this gate bias requires an extra external power supply and/or causes gate oxide reliability issues. In either event, the CMOS device 70 is suboptimal at smaller design scales.

A solution to the sub-optimal performance (e.g., speed, leakage current, and the like) of the conventional devices is found by replacing the dummy gate 78, 80 with an isolation dummy gate made from a material having an opposite work function. That is, if the FET has an n-metal work function, the dummy gate has a p-metal work function. Alternatively, if the FETs have a p-metal work function, the dummy gate has an n-metal work function. The dummy gate material choice allows for isolation improvement without the requirement of an extra external power supply and thus preserves area within the circuit. Likewise, the process of creating these semiconductor devices does not require extra changes in the conventional high-k/metal gate process. Rather, for the new dummy gate, a reverse type gate mask (which is used in the CMOS) is used to place the dummy gate. Testing shows that by reversing the work function of the dummy gate, acceptable levels of isolation are achieved while still preserving the ability to form the CMOS device using a continuous active area scheme. That is, in this example, isolation is provided in the 10 pA/μm range. The current available in the ON state is also increased due to the fact that area is preserved for the creation of stressor elements, which increases the mobility of the current mechanisms within the FETs. The use of the continuous active area scheme coupled with the improved isolation allows further miniaturization and greater design flexibility.

Figure 5:
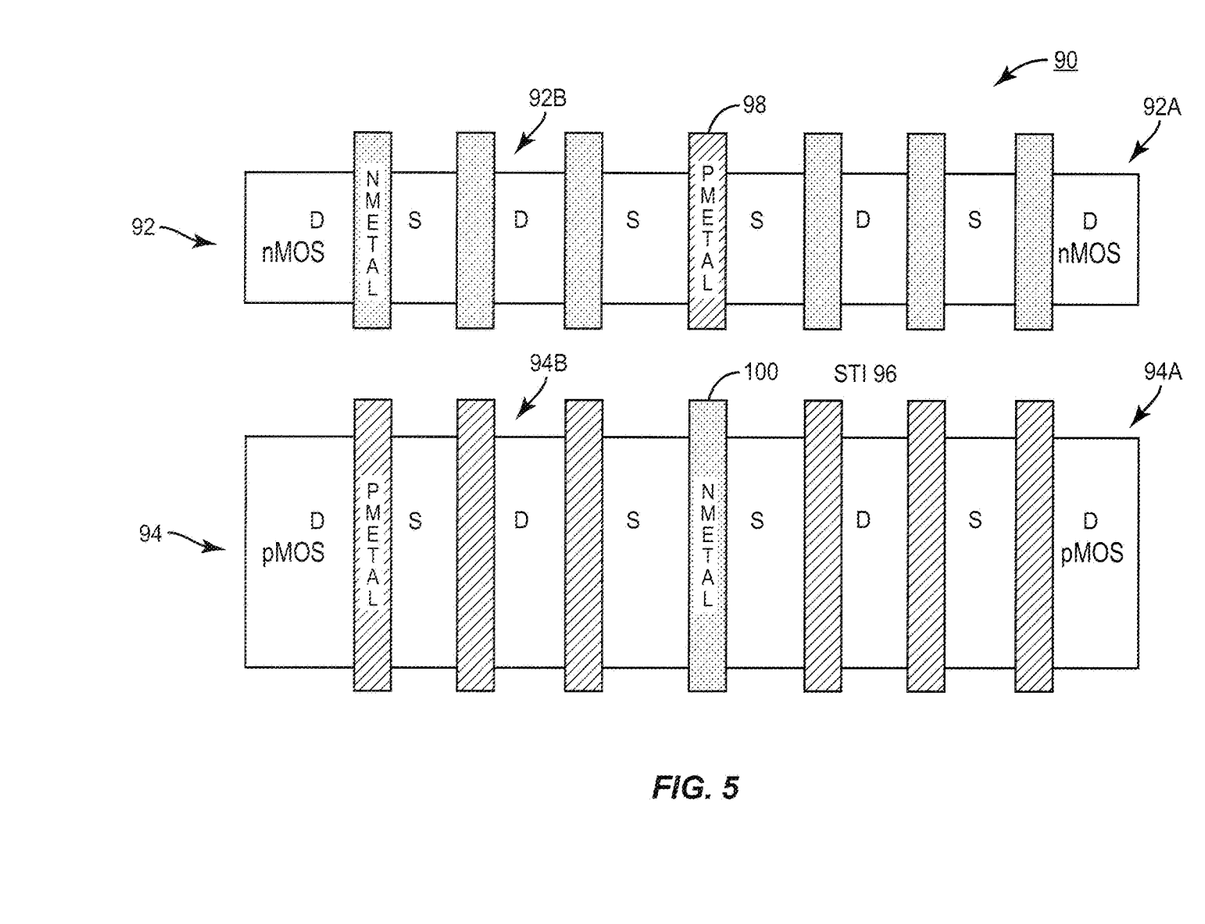
FIG. 5 is a simplified top plan diagram of an exemplary CMOS device with reverse work function dummy gate formed from a continuous active area according to an exemplary embodiment of the present disclosure.
Figure 6:
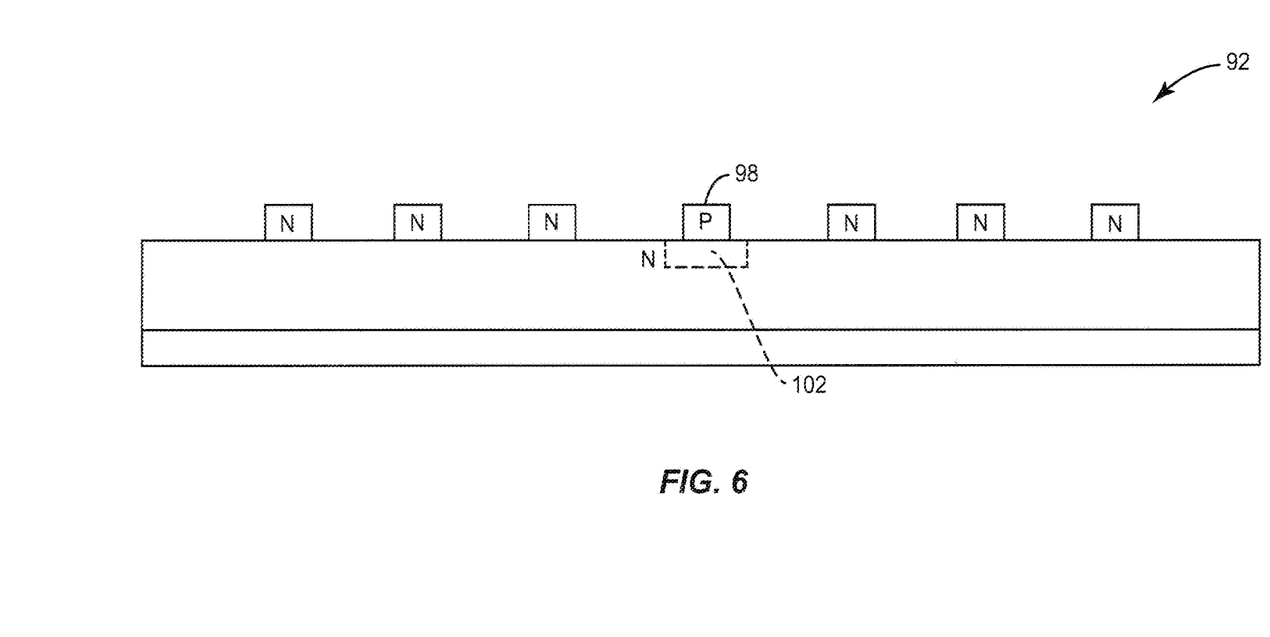
FIG. 6 is a cross-sectional view of an embodiment of the nMOS device within the CMOS device of FIG. 4 with a generally planar configuration.

In this regard, a first exemplary embodiment of a CMOS device 90 that employs dummy gates having reversed work functions is provided in FIG. 5. As illustrated, the CMOS device 90 is formed through a continuous active area scheme. In particular, the CMOS device 90 includes nMOS FETs 92A, 92B (collectively 92) and pMOS FETs 94A, 94B (collectively 94). The nMOS FET 92 is separated from the pMOS FET 94 by STI 96. As with the CMOS device 70 of FIG. 4, the nMOS FET 92A is not separated from the nMOS FET 92B by STI 96. Rather, nMOS FET 92A and nMOS FET 92B are formed from a continuous active area and are separated only by a dummy gate 98. The dummy gate 98 has a p-metal work function and thus has a work function that is opposite to the MOS device in which it is used. Stated another way, the dummy gate 98 has a reversed work function. Similarly, the pMOS FET 94A is not separated from the pMOS FET 94B by STI 96. Rather, pMOS FET 94A and pMOS FET 94B are formed from a continuous active area and are separated only by a dummy gate 100. The dummy gate 100 has an n-metal work function and thus has a work function that is opposite to the MOS device in which it is used. Stated another way, the dummy gate 100 has a reversed work function. While not shown, it should be appreciated that each of the dummy gates 98, 100 is positioned on a gate dielectric analogous to gate dielectrics 28, 40. In an exemplary embodiment, the gate dielectric of the CMOS device 90 has a high dielectric constant (k). In an exemplary embodiment, k is above eighteen (18) and in a further exemplary embodiment, k is between approximately twenty and twenty-five (20-25).

With continued reference to FIG. 5, in an exemplary embodiment, the dummy gate 98 is connected to Vss and the dummy gate 100 is coupled to Vdd. As noted, the reversal of the work function provides acceptable levels of isolation while preserving the ability of the fabricator to use a continuous active area scheme in the fabrication of the CMOS device 90. By arranging the source close to the dummy gates 98, 100, isolation leakage can be further reduced.

While FIG. 5 illustrates a CMOS device 90 having both nMOS FET 92 and pMOS FET 94, it should be appreciated that the concepts of the present disclosure may be incorporated into MOS devices containing only nMOS devices and/or only pMOS devices.

Also of note is the absence of an isolation implantation zone below the dummy gates 98, 100. Prior technologies, especially such as polygate technologies would use such an isolation implantation zone (i.e., a zone implanted with a particular type of doping) underneath dummy gates to improve the isolation provided by the dummy gate. Such isolation implantation zones increase the isolation size and do not, in general, achieve the same level of isolation. A cross sectional view of the nMOS device 92 is provided in FIG. 6, which has a zone 102 underneath the dummy gate 98 which is devoid of an isolation implantation zone. It should be appreciated that the pMOS device 94 also has an absence of an isolation implantation zone below the dummy gate 100.

Figure 7A:
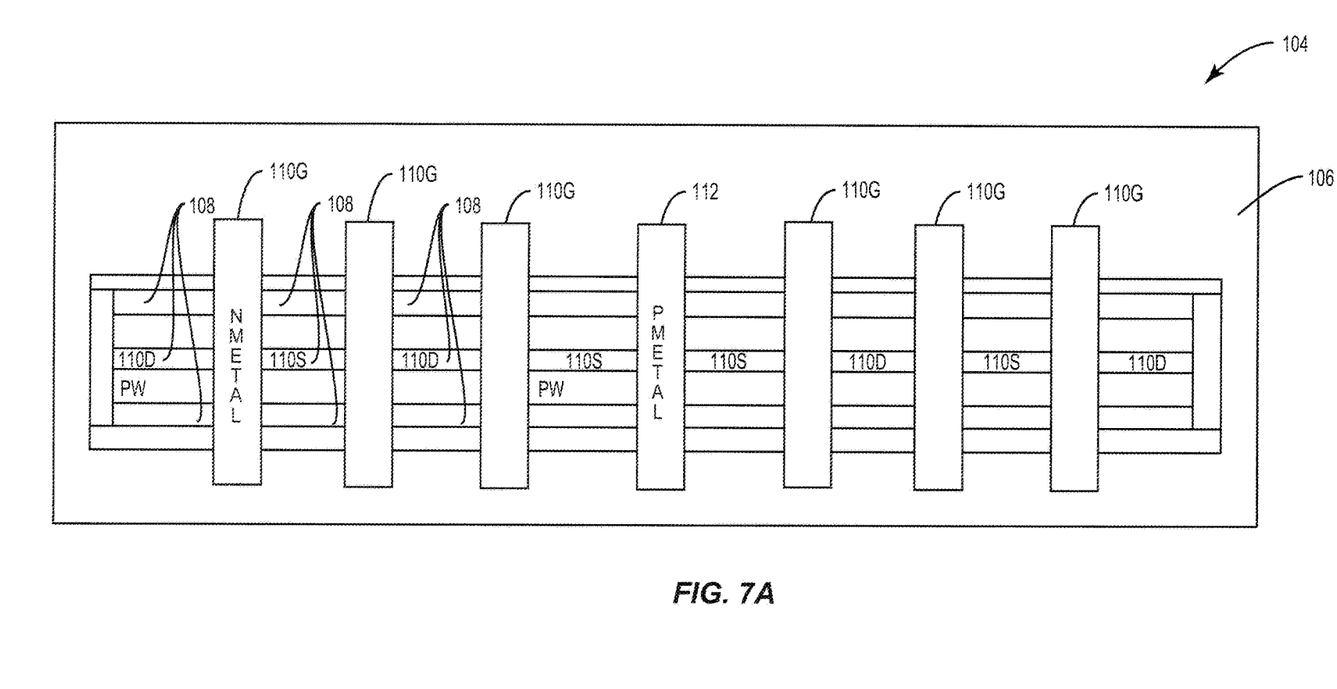
FIGS. 7A and 7B are simplified top plan views of fin-based field effect transistor (FinFET) MOS devices with dummy gates according to an exemplary embodiment of the present disclosure.
Figure 7B:
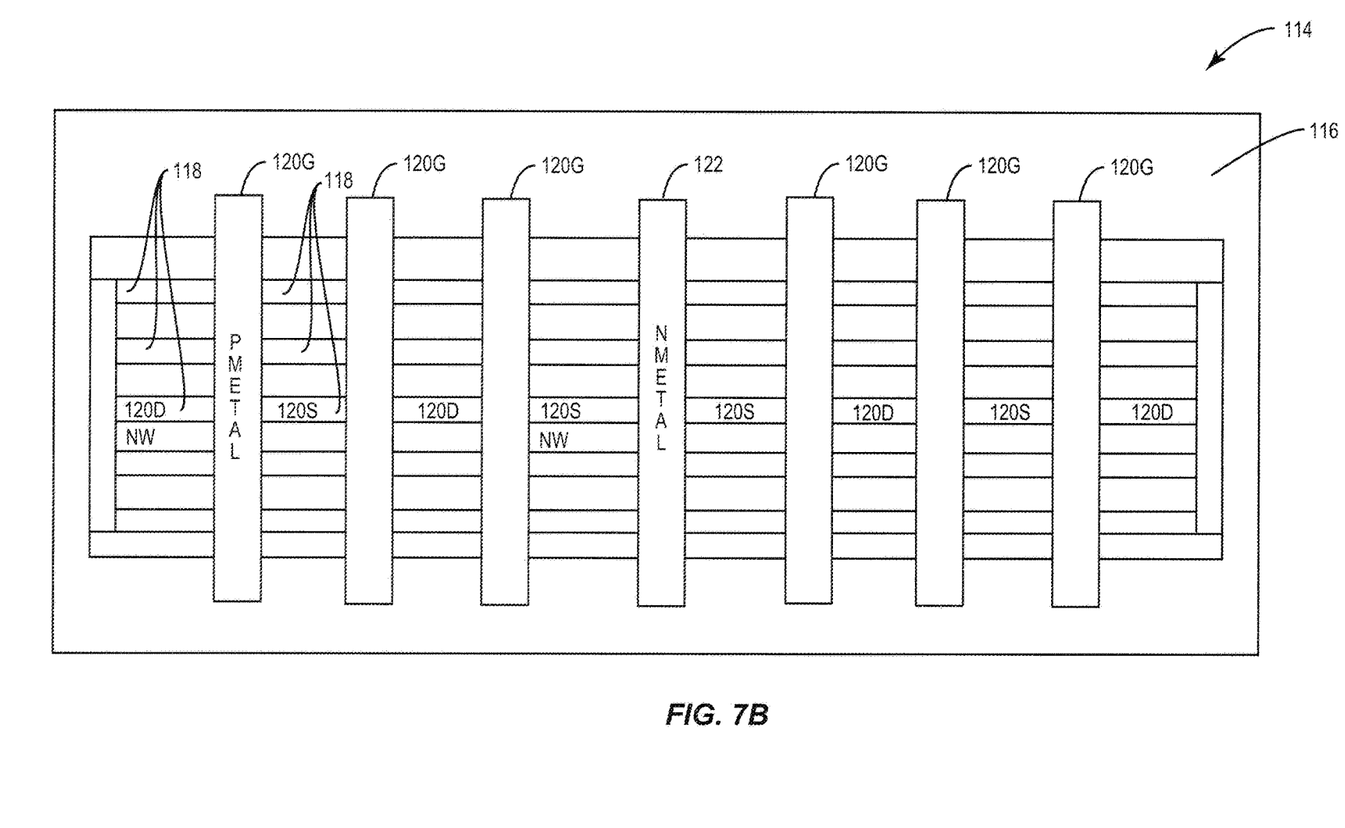

The CMOS device 90 of FIG. 5 has a generally planar configuration as is well understood, but the concepts of the present disclosure are not so limited and can be extended to a FinFET design. FIGS. 7A and 7B illustrate the two versions of the reverse metal dummy gates in FinFETs. In particular, FIG. 7A illustrates a FinFET nMOS device 104 having an active area 106 on which fins 108 are positioned perpendicularly along with gates 110G. The FinFET nMOS device 104 further includes sources 110S, and drains 110D. In the FinFET nMOS device 104, the work function of the active device gate is an n-metal and the corresponding dummy gate 112 has a p-metal work function. By arranging the source close to the dummy gate 112, isolation leakage can be further reduced.

In contrast to the FinFET nMOS device 104 of FIG. 7A, a FinFET pMOS device 114 is illustrated in FIG. 7B. The FinFET pMOS device 114 includes an active area 116 and fins 118. Likewise, the FinFET pMOS device 114 includes drains 120D, sources 120S, and gates 120G. The active area 116 of FinFET pMOS device 114 has a p-metal work function, and the corresponding dummy gate 122 has an n-metal work function. By arranging the source close to the dummy gate 122, isolation leakage can be further reduced.

The nMOS device 104 and the pMOS device 114 may be assembled into a CMOS device if desired. Again, the absence of an implantation isolation zone and a high gate dielectric allow speed to be improved even at increasingly smaller sizes.

The CMOS isolation schemes with continuous active areas according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
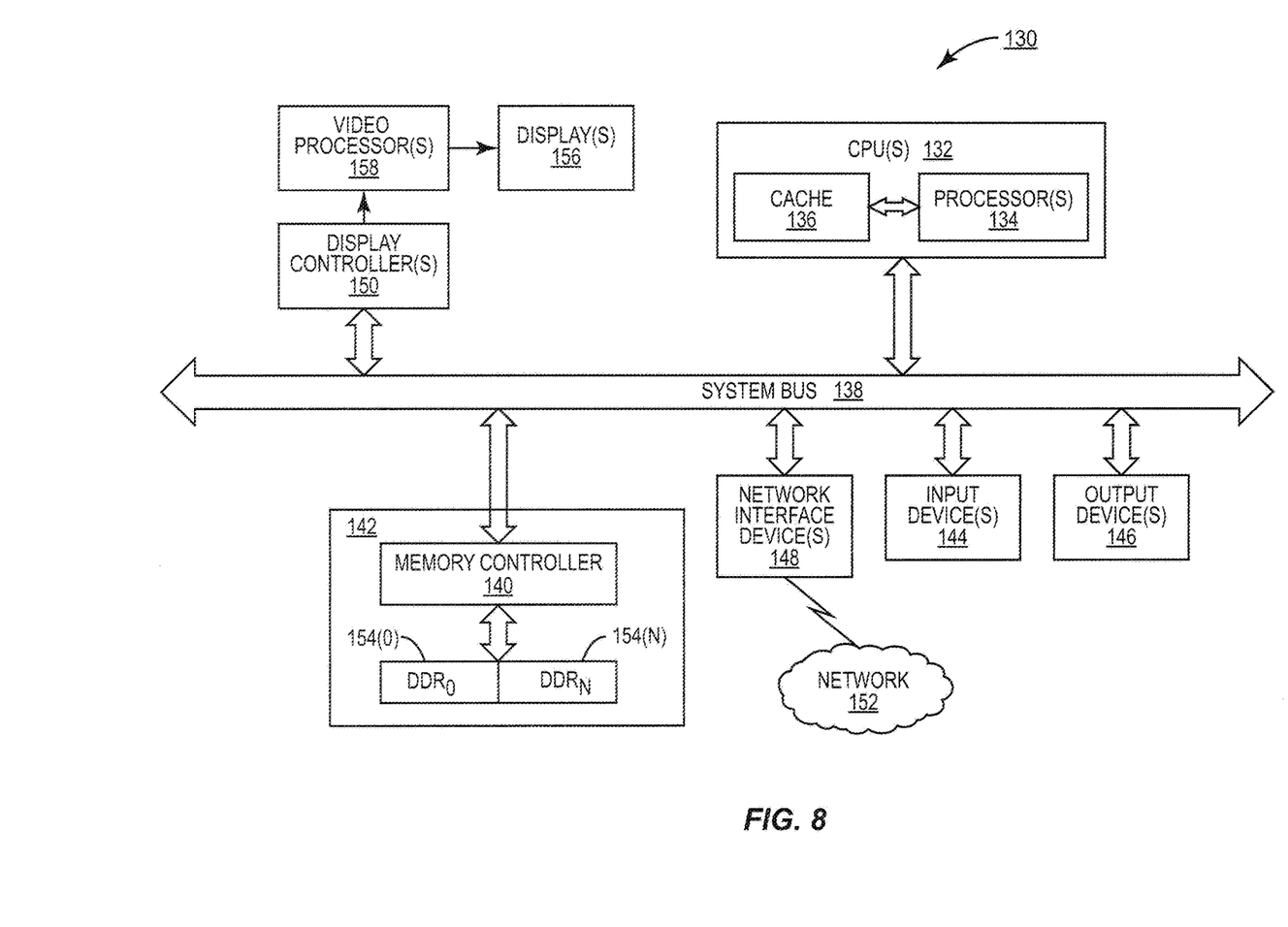
FIG. 8 is a block diagram of an exemplary processor-based system that can include the CMOS devices of FIG. 5.

In this regard, FIG. 8 illustrates an example of a processor-based system 130 that can employ a CMOS device such as CMOS device 90 or MOS devices 92, 94, 104, 114. In this example, the processor-based system 130 includes one or more central processing units (CPUs) 132, each including one or more processors 134. The CPU(s) 132 may have cache memory 136 coupled to the processor(s) 134 for rapid access to temporarily stored data. The CPU(s) 132 is coupled to a system bus 138 and can intercouple master devices and slave devices included in the processor-based system 130. As is well known, the CPU(s) 132 communicates with these other devices by exchanging address, control, and data information over the system bus 138. For example, the CPU(s) 132 can communicate bus transaction requests to the memory controller 140. Although not illustrated in FIG. 8, multiple system buses 138 could be provided, wherein each system bus 138 constitutes a different fabric.

Other devices can be connected to the system bus 138. As illustrated in FIG. 8, these devices can include a memory system 142, one or more input devices 144, one or more output devices 146, one or more network interface devices 148, and one or more display controllers 150, as examples. The input device(s) 144 can include any type of input device, including but not limited to input keys, switches, voice processors, etc. The output device(s) 146 can include any type of output device, including but not limited to audio, video, other visual indicators, etc. The network interface device(s) 148 can be any devices configured to allow exchange of data to and from a network 152. The network 152 can be any type of network, including but not limited to a wired or wireless network, private or public network, a local area network (LAN), a wide local area network (WLAN), and the Internet. The network interface device(s) 148 can be configured to support any type of communication protocol desired. The memory system 142 can include one or more memory units 154(0-N).

The CPU(s) 132 may also be configured to access the display controller(s) 150 over the system bus 138 to control information sent to one or more displays 156. The display controller(s) 150 sends information to the display(s) 156 to be displayed via one or more video processors 158, which process the information to be displayed into a format suitable for the display(s) 156. The display(s) 156 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A metal oxide semiconductor (MOS) device comprising:
    a first material having a first n-metal or p-metal work function;
    a first plurality of gates comprising the first material;
    a second plurality of gates comprising the first material; and
    a dummy gate positioned between the first plurality of gates and the second plurality of gates and the dummy gate comprising a second material having a work function opposite that of the first material, wherein the dummy gate is connected to one of a Vss or a Vdd to fix a voltage level for the dummy gate.

2. The MOS device of claim 1, wherein the first material comprises a material having an n-metal work function.

3. The MOS device of claim 1, wherein the second material comprises a material having a p-metal work function.

4. The MOS device of claim 1, wherein the first material comprises a material having a p-metal work function.

5. The MOS device of claim 1, wherein the second material comprises a material having an n-metal work function.

6. The MOS device of claim 1, further comprising a second MOS device to form a complementary MOS device (CMOS), the second MOS device comprising:
    a third gate comprising the second material;
    a fourth gate comprising the second material; and
    a second dummy gate positioned between the third gate and the fourth gate and comprising the first material, wherein the second dummy gate is connected to the Vss or the Vdd to fix a voltage level for the second dummy gate opposite that of the dummy gate.

7. The MOS device of claim 6, further comprising a shallow trench isolation (STI) between the MOS device and the second MOS device.

8. The MOS device of claim 1, wherein the dummy gate is positioned on a gate dielectric and lacks an isolation implantation zone under the dummy gate.

9. The MOS device of claim 1, wherein the MOS device is a substantially planar device.

10. The MOS device of claim 1, wherein the MOS device is a fin-based field effect transistor (FinFET) device.

11. The MOS device of claim 1, wherein the MOS device is integrated into a semiconductor die.

12. The MOS device of claim 1, further comprising a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the MOS device is integrated.

13. The MOS device of claim 1, further comprising a gate dielectric underneath each gate, the gate dielectric comprising a dielectric constant (k) greater than approximately eighteen (18).

* * * * *